(12) United States Patent
Youn et al.

(10) Patent No.: US 11,837,119 B2
(45) Date of Patent: Dec. 5, 2023

(54) DISPLAY DEVICE

(71) Applicant: LG Display Co., Ltd, Seoul (KR)

(72) Inventors: Yeoo Youn, Paju-si (KR); JeongBeom Park, Paju-si (KR)

(73) Assignee: LG Display Co., Ltd, Seoul (KR)

( * ) Notice: Subject to any disclaimer, the term of this patent is extended or adjusted under 35 U.S.C. 154(b) by 351 days.

(21) Appl. No.: 17/090,829

(22) Filed: Nov. 5, 2020

(65) Prior Publication Data

US 2021/0150945 A1    May 20, 2021

(30) Foreign Application Priority Data

Nov. 20, 2019  (KR) .................. 10-2019-0149590

(51) Int. Cl.
*G09F 9/30* (2006.01)
*G06F 1/16* (2006.01)
(Continued)

(52) U.S. Cl.
CPC ............ *G09F 9/301* (2013.01); *C09J 153/00* (2013.01); *G06F 1/06* (2013.01); *G06F 1/1609* (2013.01);
(Continued)

(58) Field of Classification Search
CPC ... G09F 9/301; C09J 153/00; C09J 2301/408; C09J 2301/414; C09J 2425/00;
(Continued)

(56) References Cited

U.S. PATENT DOCUMENTS

2009/0305068 A1* 12/2009 Morishita .................. C09J 9/02
524/505
2012/0109035 A1*  5/2012 Zhang ........................ C09J 4/00
524/521

(Continued)

FOREIGN PATENT DOCUMENTS

CN    101548204 A    9/2009
FR      2889194 A1   2/2007

(Continued)

OTHER PUBLICATIONS

Chinese Office Action, dated Dec. 29, 2021, for Chinese Application No. 202011000041.2, 15 pages. (with English Translation).

(Continued)

*Primary Examiner* — Anthony J Frost
(74) *Attorney, Agent, or Firm* — SEED IP LAW GROUP LLP (57) ABSTRACT

A display device including a display panel, a variable adhesive layer disposed on the display panel and a cover member disposed on the variable adhesive layer is provided. The variable adhesive layer includes a block copolymer and a plasticizer mixture, and the plasticizer mixture has a low critical solution temperature (LCST) of 60° C. to 80° C. The plasticizer mixture is phase-separated into two phases at a temperature equal to or higher than the low critical solution temperature, thereby significantly lowering adhesion of the variable adhesive layer. Accordingly, the display device of the present disclosure has excellent adhesion reliability and provides an advantage of easy reworking since the adhesion significantly decreases at a temperature equal to or higher than the low critical solution temperature. In addition, the display device has excellent folding characteristics due to the presence of the plasticizers.

16 Claims, 4 Drawing Sheets

(51) Int. Cl.
*C09J 153/00* (2006.01)
*G06F 1/06* (2006.01)
*H10K 59/00* (2023.01)
*H10K 77/10* (2023.01)
*C08K 5/12* (2006.01)
*C08K 5/00* (2006.01)
*C08L 23/22* (2006.01)

(52) U.S. Cl.
CPC ........... *G06F 1/1652* (2013.01); *H10K 59/00* (2023.02); *H10K 77/111* (2023.02); *C08K 5/0016* (2013.01); *C08K 5/12* (2013.01); *C08L 23/22* (2013.01); *C09J 2301/408* (2020.08); *C09J 2301/414* (2020.08); *C09J 2425/00* (2013.01); *C09J 2433/00* (2013.01); *G02F 2202/08* (2013.01); *G02F 2202/28* (2013.01)

(58) Field of Classification Search
CPC ........ C09J 2433/00; C09J 11/06; C09J 11/08; C09J 201/00; C09J 2203/318; C09J 2301/312; G06F 1/16; G06F 1/1609; G06F 1/1652; H01L 27/32; H01L 51/0097; H01L 51/5246; H01L 2251/5338; C08K 5/0016; C08K 5/12; C08L 23/22; C08L 53/00; G02F 2202/08; G02F 2202/28; G02F 1/1339; Y02E 10/549
See application file for complete search history.

(56) References Cited

U.S. PATENT DOCUMENTS

2013/0186565 A1* 7/2013 Arimitsu ............. H01L 21/6836
428/323
2016/0259092 A1* 9/2016 Shibata ................. G02B 1/118
2018/0346770 A1* 12/2018 Itano ...................... B32B 15/10

FOREIGN PATENT DOCUMENTS

| JP | 2015-131922 A | 7/2015 |
| JP | 6346170 B2 | 6/2018 |
| KR | 10-2015-0141929 A | 12/2015 |
| KR | 10-1880682 B1 | 7/2018 |
| KR | 10-2019-0093180 A | 8/2019 |
| KR | 10-2011148 B1 | 8/2019 |
| RU | 2015154535 A | 6/2017 |
| WO | 02/08137 A2 | 1/2002 |
| WO | 2007/012763 A1 | 2/2007 |
| WO | 2015/088368 A1 | 6/2015 |

OTHER PUBLICATIONS

Schumacher, K.H. et al.; Water-Borne Removable Pressure Sensitive Adhesives—Challenges and Novel Technical Concepts; 2010; p. 1-8.

* cited by examiner

DISPLAY DEVICE

CROSS-REFERENCE TO RELATED APPLICATIONS

This application claims the priority benefit of Korean Patent Application No. 10-2019-0149590, filed Nov. 20, 2019, with the Korean Intellectual Property Office, the disclosure of which is incorporated herein by reference.

BACKGROUND

Technical Field

The present disclosure relates to a display device and more particularly, to a display device having excellent adhesion reliability and folding characteristics, and allowing for easy reworking while minimizing damage to components, if necessary.

Description of the Related Art

Various display devices, such as organic light emitting display devices (OLEDs) and liquid crystal display device (LCDs), have a cover member disposed in the front thereof to prevent the display device from being damaged due to external impacts or the like. In this case, a display panel and the cover member are bonded to each other by an adhesive member such as an optically clear adhesive (OCA) film or an OCA resin. However, in a bonding process, air bubbles may be generated on a bonding surface or foreign substances may be included, and various bonding defects such as discrepancy in bonding positions may occur. In this case, reworking is required to separate bonded components. Accordingly, rework methods for separating components bonded by an adhesive, or reworkable adhesives are being actively studied.

Further, a foldable display device capable of being thinly manufactured by replacing a glass substrate of the display device with a flexible substrate to thereby implement flexible characteristics, and capable of maintaining display performance even when the display device is folded, has rapidly emerged as a next-generation display device. Accordingly, there is a need to develop techniques for a novel adhesive member allowing for easy reworking and a reduction in folding stress.

SUMMARY

To perform a reworking process, an adhesive is preferably to have properties in which adhesion is high at around room temperature and rapidly decreases at a reworking temperature. However, in well-known reworkable adhesives, adhesion tends to gradually decrease with increase in temperature, and the adhesion is significantly lowered at a temperature lower than the reworking temperature, resulting in deteriorated adhesion reliability.

In addition, conventional reworkable adhesives implement reworkable properties in a manner of foaming a foaming material at high temperature by introducing the foaming material or a thermally expandable material, or in a manner of reducing adhesion by inducing expansion of a thermally expandable material. However, heating at a significantly high temperature (100° C.) is required for the foaming or expansion, and in this case, components constituting a display device are damaged in a reworking process. In addition, there are difficulties in controlling foaming properties and thermal expansion properties, and foaming or expansion occurs before the reworking temperature, whereby adhesion is lowered in a temperature range in which high adhesiveness should be maintained.

Accordingly, the inventors of the present disclosure have invented a variable adhesive film capable of easily controlling adhesion in each temperature range, thereby allowing for excellent adhesion reliability and easy reworking.

An object to be achieved by the present disclosure is to provide a display device having excellent adhesion reliability and allowing for easy reworking, by using a variable adhesive film having properties, in which adhesion does not deteriorate and is highly maintained to a certain level or more within a temperature range requiring adhesion reliability and rapidly decreases within a reworking temperature range. Further, the present disclosure is intended to reduce costs and increase convenience by replacing only a cover member, not the entire panel, when replacement is required due to the occurrence of cracks or scratches on an upper portion of the cover member.

Another object to be achieved by the present disclosure is to provide a display device having excellent folding characteristics by using a variable adhesive capable of easily alleviating folding stress, while having excellent light transmittance and display quality.

Objects of the present disclosure are not limited to the above-mentioned objects, and other objects, which are not mentioned above, can be clearly understood by those skilled in the art from the following descriptions.

According to an aspect of the present disclosure, a display apparatus comprises a display panel; a variable adhesive layer disposed on the display panel; and a cover member disposed on the variable adhesive layer, wherein the variable adhesive layer includes a block copolymer and a plasticizer mixture, wherein the plasticizer mixture has a low critical solution temperature of 60° C. to 80° C.

Other detailed matters of the exemplary embodiments are included in the detailed description and the drawings.

In a display device according to an exemplary embodiment of the present disclosure, a display panel and a cover member are bonded to each other through a variable adhesive layer including a block copolymer and a plasticizer mixture having a low critical solution temperature of 60° C. to 80° C. The plasticizer mixture is phase-separated at a temperature equal to or higher than the low critical solution temperature, thereby significantly lowering adhesion of the variable adhesive layer. Accordingly, the display device of the present disclosure provides an advantage of easy reworking since the adhesion significantly decreases, at a temperature equal to or higher than the low critical solution temperature of the plasticizer mixture. In addition, since the plasticizer mixture is present in a single phase at a temperature lower than the low critical solution temperature, the adhesion of the variable adhesive layer is maintained high at the temperature lower than the low critical solution temperature, so that a display device having excellent adhesion reliability is provided.

That is, the variable adhesive layer is characterized by minimizing an adhesion gradient according to temperature and exhibiting an on-off function. Specifically, the variable adhesive layer has an adhesion (on-mode), at a temperature lower than the low critical solution temperature of the plasticizer mixture but does not have the adhesion (off-mode), at a temperature equal to or higher than the low critical solution temperature of the plasticizer mixture. Accordingly, the display device of the present disclosure can have an advantage of easy reworking without damage to components when adhesion defects occur or when replacement of the cover member is required, thereby contributing to a reduction in cost and an increase in convenience.

The variable adhesive layer of the present disclosure exhibits low modulus characteristics within a wide temperature range including low temperature, room temperature, and high temperature, and thus, can easily alleviate folding stress when folding the display device. Therefore, the display device can be easily implemented as a foldable display device.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

In describing embodiments in the present specification, room temperature means 15° C. to 25° C., unless otherwise specified.

Hereinafter, the present disclosure will be described in detail with reference to accompanying drawings.

Figure 1:
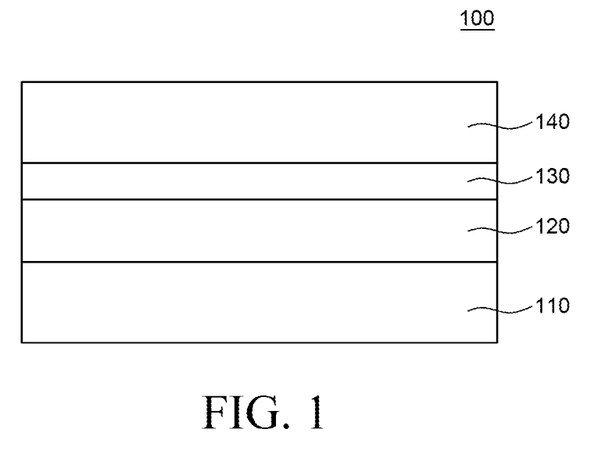
FIG. 1 is a schematic cross-sectional view of a display device according to an exemplary embodiment of the present disclosure.

FIG. 1 is a schematic cross-sectional view of a display device according to an exemplary embodiment of the present disclosure. With reference to FIG. 1, a display device 100 according to an exemplary embodiment of the present disclosure includes a display panel 110, an optical control layer 120, a variable adhesive layer 130, and a cover member 140.

The display panel 110 includes a display area and a non-display area. The display area is an area where a plurality of pixels are disposed to display an image. The pixels including light emitting areas for displaying an image and a driving circuit for driving the pixels may be disposed in the display area. The non-display area is disposed to surround the display area. The non-display area is an area where an image is not displayed, and is an area where various lines, driver ICs, printed circuit boards, and the like for driving the pixels and driving circuits disposed in the display area are disposed. Various ICs such as a gate driver IC and a data driver IC may be disposed in the non-display area. Meanwhile, as described above, driver ICs, printed circuit boards and the like may be disposed in the non-display area, and a predetermined area is required for the driver ICs, the printed circuit boards, and the like.

For example, the display panel 110 may be a liquid crystal display panel 110 which includes a liquid crystal layer and displays an image by adjusting a light transmittance of liquid crystals. As another example, the display panel 110 may be an organic light emitting display panel 110 which includes an organic light emitting layer and displays an image by using light emitted from the organic light emitting layer. Unlike the liquid crystal display panel 110, the organic light emitting display panel 110 is a self-light emitting display device that does not require a separate light source. The organic light emitting display panel 110 is thin and has excellent flexibility. Meanwhile, the display device 100 according to an exemplary embodiment of the present disclosure is advantageous for being embodied as a foldable display device 100 by bonding the display panel 110 and the cover member 140 with the use of the variable adhesive layer 130 capable of effectively reducing folding stress. Therefore, when the organic light emitting display panel 110 is used, it provides more excellent folding characteristics due to a synergy effect. Hereinafter, the display device 100 according to an exemplary embodiment of the present disclosure is described assuming that the display panel 110 is the organic light emitting display panel 110, but the display panel 110 is not limited to the organic light emitting display panel 110.

For example, the organic light emitting display panel 110 includes a substrate, a thin film transistor, an anode, an organic light emitting layer, and a cathode.

The substrate supports various elements of the organic light emitting display panel 110. The substrate may be glass or a plastic substrate having flexibility. For example, the plastic substrate may be selected from among polyimide, polyethersulfone, polyethylene terephthalate, and polycarbonate, but is not limited thereto.

When a plastic substrate is used, a thickness thereof is small and thus, sagging may occur. Accordingly, a back plate may be disposed on a rear surface of the display panel 110 to stably support elements constituting the display panel 110. The back plate may be, for example, a metal material such as stainless steel, or a plastic material. Plastics that can be used as the backplate include polymethyl methacrylate, polycarbonate, polyvinyl alcohol (PVA), acrylonitrile-butadiene-styrene (ABS), polyethylene terephthalate, polystyrene (PS), silicone-acryl resin, and the like, but are not limited thereto.

The thin film transistor is disposed on the substrate and drives the organic light emitting display panel 110. For example, the thin film transistor includes a gate electrode, an active layer, a source electrode, and a drain electrode. The anode is disposed on the thin film transistor, and the anode is electrically connected to the source electrode or drain electrode.

The organic light emitting layer is disposed between the anode and the cathode, and holes injected from the anode and electrons injected from the cathode combine with each other in the organic light emitting layer to emit light.

A protective layer may be disposed on the display panel 110 to flatten an upper portion of the display panel 110 and prevent penetration of moisture or oxygen from the outside. The protective layer may be a single layer or may be formed in a multilayer structure as needed. For example, the protective layer may be composed of at least one organic layer and at least two inorganic layers, and may have a multilayer structure in which an organic layer is disposed between two inorganic layers. However, the present disclosure is not limited thereto.

The display device 100 may further include a touch electrode. For example, the touch electrode may be disposed on the protective layer, may be formed directly on the display panel 110, or may be disposed inside the display panel 110 to realize a slim thickness.

The optical control layer 120 is disposed on the display panel 110. For example, the optical control layer 120 may be a polarizing layer that uniformly transmits light emitted from the display panel 110 to the outside without lowering luminance. As another example, the optical control layer 120 may be an anti-reflection layer. The anti-reflection layer absorbs or reflects external light. Accordingly, light transmitted from the outside of the display device 100 may be reflected on a metal layer inside the display panel 110, thereby decreasing a contrast ratio. In this case, reflectance of external light may be minimized by the anti-reflection layer, thereby improving display quality. As another example, the optical control layer 120 may be a light diffusion layer. The light diffusion layer has an uneven structure on a surface thereof by transparent beads. Accordingly, external light is scattered on the surface of the light diffusion layer to minimize external light reflectance. The optical control layer 120 may be composed of a single layer, or may be formed in a multilayer structure in which layers having different functions are stacked, if necessary.

The cover member 140 is disposed on the display panel 110 to protect the display panel 110 from being damaged by external impacts or from being scratched. The cover member 140 may be formed of a material having excellent impact resistance and light transmittance. For example, the cover member 140 may be tempered glass or transparent plastic. For example, the transparent plastic may be selected from polymethyl methacrylate (PMMA), polycarbonate (PC), a cycloolefin polymer, polyethylene terephthalate (PET), polyimide (PI), and the like, but is not limited thereto.

The cover member 140 is bonded to the display panel 110 by the variable adhesive layer 130.

Figure 2:
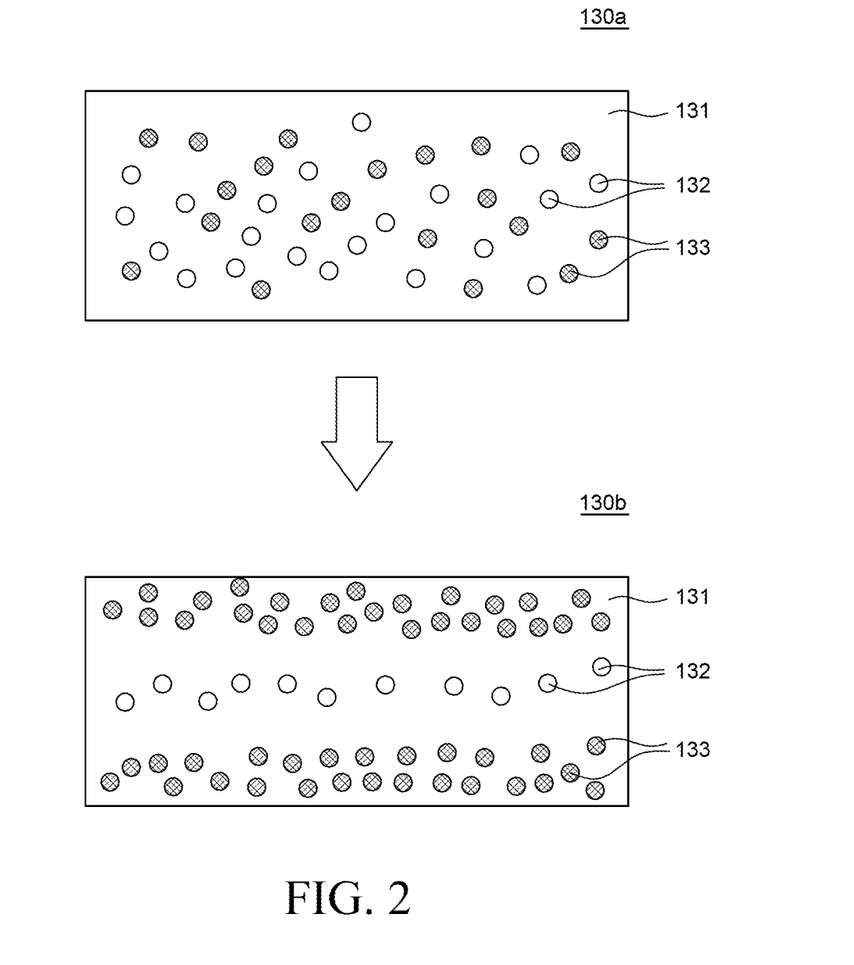
FIG. 2 is schematic cross-sectional views of a variable adhesive layer for explaining phase separation behavior of first plasticizers and second plasticizers.

Hereinafter, the variable adhesive layer of the present disclosure will be described in detail with reference to FIG. 2. FIG. 2 is schematic cross-sectional views of a variable adhesive layer for explaining phase separation behavior of first plasticizers and second plasticizers.

First, with reference to FIG. 1, the variable adhesive layer 130 may be disposed between the display panel 110 and the cover member 140. The variable adhesive layer 130 is disposed on the optical control layer 120 and bonds the optical control layer 120 and the cover member 140. The optical control layer 120 may be omitted, if necessary, and in this case, the variable adhesive layer 130 bonds the display panel 110 and the cover member 140.

The variable adhesive layer 130 includes a block copolymer 131, first plasticizers 132, and second plasticizers 133.

The block copolymer 131 is a base resin for configuring the variable adhesive layer 130 and is optically transparent. The block copolymer 131 includes two types of blocks having different glass transition temperatures. For example, the block copolymer 131 includes a first block having a glass transition temperature of −20° C. or less and a second block having a glass transition temperature of 80° C. or more. As another example, the glass transition temperature of the first block may be from −80° C. to −20° C. or from −60° C. to −40° C., and within this range, excellent advantages in terms of adhesion and low temperature folding characteristics of the variable adhesive layer 130 are provided. As another example, the glass transition temperature of the second block may be from 80° C. to 120° C. or from 90 to 110° C.

The first block exhibits relatively soft properties in the block copolymer 131 since it has a low glass transition temperature, and the second block exhibits relatively hard properties since it has a high glass transition temperature. As such, the block copolymer 131 including two types of blocks having different glass transition temperatures exists in a micro-phase separation state in the variable adhesive layer 130. That is, the block copolymer 131 forms a hard domain and a soft domain in the variable adhesive layer 130, and accordingly, the variable adhesive layer 130 has flexibility and high adhesion.

A glass transition temperature Tg can be measured using a dynamic shear rheometer. For example, it can be measured in a dynamic temperature sweep mode using a rotary rheometer ARES-G2 manufactured by Waters-TA company. Specifically, under conditions of strain 1% and frequency 1 Hz, sample's shear storage moduli G', loss moduli G" and tangent delta G are measured at a heating rate of 5° C./min in a temperature range of −60° C. to 100° C. Starting from the glass transition temperature, the shear storage modulus of a material decreases, and the tangent delta thereof increases. Thus, the glass transition temperature can be determined by a maximum peak of the tangent delta.

The second block exhibits relatively brittle and hard properties due to the high glass transition temperature. Therefore, when the content of the second block in the block copolymer 131 is high, folding characteristics of the variable adhesive layer 130 decrease, and the temperature at which reworking is feasible increases. The first block has relatively flexible properties due to the low glass transition temperature, and improves the folding characteristics of the variable adhesive layer 130. For example, a weight ratio of the first block to the second block may be from 65:35 to 85:15, and within this range, low temperature folding characteristics of the variable adhesive layer 130 is excellent, and reworking is facilitated. When a ratio of the second block in the block copolymer exceeds 35% by weight, the folding characteristics are lowered, and the temperature at which reworking is feasible increases since the adhesion and modulus is high at high temperature. When a reworking process temperature increases, thermal deformation of the display panel 110 and the optical control layer 120 may occur during reworking.

The first block may be a repeating unit derived from an alkyl acrylate compound. For example, the alkyl acrylate compound may be an alkyl acrylate having an alkyl group having 1 to 18 carbon atoms. For example, the alkyl acrylate may be one or more selected from among methyl acrylate, ethyl acrylate, n-butyl acrylate, t-butyl acrylate, sec-butyl acrylate, pentyl acrylate, 2-ethylhexyl acrylate, 2-ethylbutyl acrylate, n-octyl acrylate, iso-octyl acrylate, iso-nonyl acrylate, lauryl acrylate, and tetradecyl acrylate, but is not limited thereto. For example, the first block may be a single homopolymer of one type or a copolymer of two or more types selected from the alkyl acrylate compounds listed above.

The second block may be a repeating unit derived from one or more selected from an alkyl methacrylate compound and a vinyl aromatic compound. For example, the second block may be a repeat unit derived from an alkyl methacrylate alone, a vinyl aromatic compound alone, or mixtures thereof. The alkyl methacrylate compound may be an alkyl methacrylate having an alkyl group having 1 to 18 carbon atoms. For example, the alkyl methacrylate may be one or more selected from methyl methacrylate, ethyl methacrylate, t-butyl methacrylate, iso-butyl methacrylate, iso-propyl methacrylate, n-propyl methacrylate, and octadecyl methacrylate, but is not limited thereto. For example, the vinyl aromatic compound may be one or more selected from styrene, 3-methyl styrene, 4-isopropyl styrene, 4-methyl styrene, 2-chloro styrene, and 4-chloro styrene, but is not limited thereto.

The block copolymer 131 may be a diblock copolymer 131 composed of a first block and a second block (first block-second block), and may also be a triblock copolymer 131 composed of two first blocks and a second block (first block-second block-first block). For example, the block copolymer 131 is a diblock copolymer 131 of polybutylacrylate-polymethylmethacrylate, a diblock copolymer 131 of polybutylacrylate-polystyrene, a triblock copolymer 131 of polymethylmethacrylate-polybutylacrylate-polymethyl methacrylate, or a triblock copolymer 131 of polymethyl methacrylate-polybutyl acrylate-polystyrene, but is not limited thereto. A weight average molecular weight of the block copolymer 131 may be from 70,000 g/mol to 100,000 g/mol, and within this range, both folding characteristics and adhesive properties of the variable adhesive layer 130 are excellent.

A polydispersity index (PDI) of the block copolymer 131 may be from 1.00 to 1.15 or from 1.01 to 1.10. When the polydispersity index (PDI) of the block copolymer 131 is within this range, it is advantageous in that an adhesion gradient according to temperature can be minimized in a range of temperature below the reworking process temperature, and uniform physical properties may be provided.

The polydispersity index (PDI) and the weight average molecular weight of the block copolymer 131 can be measured by gel permeation chromatography (GPC), and in this case, polystyrene or polymethyl methacrylate may be used as a standard material.

A plasticizer mixture including the first plasticizers 132 and the second plasticizers 133 has a low critical solution temperature (LCST). The upper one in FIG. 2 is a view schematically illustrating a cross-section of a variable adhesive layer 130a at a temperature lower than the low critical solution temperature, and the lower one in FIG. 2 is a view schematically illustrating a cross-section of a variable adhesive layer 130b at a temperature equal to or higher than the low critical solution temperature. With reference to the upper one in FIG. 2, the first plasticizers 132 and the second plasticizers 133 are mixed and present in a single phase at a temperature lower than the low critical solution temperature. With reference to the lower one in FIG. 2, the first plasticizers 132 and the second plasticizers 133 are phase-separated and present in two phases at a temperature equal to or higher than the low critical solution temperature. The first plasticizers 132 and the second plasticizers 133 separated into two phases at the temperature equal to or higher than the low critical solution temperature significantly degrade the adhesion of the variable adhesive layer 130. Accordingly, by adjusting temperature based on the low critical solution temperature of the mixture of the first plasticizers 132 and the second plasticizers 133, it is feasible to implement on-off characteristics in which adhesion is provided or not provided. More specifically, adhesion is provided at a temperature lower than the low critical solution temperature of the plasticizer mixture (on-mode) but adhesion is not provided at a temperature equal to or higher than the low critical solution temperature of the plasticizer mixture (off-mode). By using the on-off characteristics, the display panel 110 and the cover member 140 that are bonded by the variable adhesive layer 130 can be easily separated from each other, if necessary. The low critical solution temperature of the first plasticizers 132 and the second plasticizers 133 may be adjusted by adjusting types of the first plasticizers 132 and the second plasticizers 133 and concentrations thereof.

For example, the low critical solution temperature of the first plasticizers 132 and the second plasticizers 133 may be from 60° C. to 80° C. or from 70° C. to 80° C. When the low critical solution temperature of the first plasticizers 132 and the second plasticizers 133 is within the above range, adhesion reliability and easiness of reworking may be simultaneously satisfied. To satisfy the adhesion reliability, adhesion on a level equivalent to initial adhesiveness should be maintained in a range of temperature from room temperature to about 60° C. Since the first plasticizers 132 and the second plasticizers 133 exist in a single phase at a temperature lower than the lower critical solution temperature, the adhesion of the variable adhesive layer 130a is maintained high, and the adhesion reliability of the display device is excellent.

The first plasticizers 132 and the second plasticizers 133 are separated into two phases at the temperature equal to or higher than the low critical solution temperature, thereby significantly reducing the adhesion of the variable adhesive layer 130b. In the range of temperature at which the two types of plasticizers are phase-separated, thereby causing a rapid decrease in the adhesion, reworking is feasible, and a reworking process can be easily performed when bonding defects occur or the replacement of the cover member 140 is required. In this case, if the low critical solution temperature exceeds 80° C., a reworking process is also feasible at high temperature exceeding 80° C. However, when the reworking process temperature exceeds 80° C., deterioration may occur in materials constituting the display device 100 in a high temperature reworking process, which is not preferable.

Phase separation of the first plasticizers 132 and the second plasticizers 133 is phase separation due to incompatibility between different components, and may be defined as macro-phase separation. That is, the first plasticizers 132 and the second plasticizers 133 exhibit macro-phase separation behavior in that they are mixed with each other and maintain a single phase, but they are separated into two phases due to reduced compatibility between components under specific temperature conditions. Fine phase separation of the block copolymer 131 described above is different from the macro-phase separation of the first plasticizers 132 and the second plasticizers 133 in that components of the block copolymer 131 maintain a state in which they are connected to each other by covalent bonding.

With reference to the lower one in FIG. 2, the second plasticizers 133 migrate to a surface of the variable adhesive layer 130b at the temperature equal to or higher than the low critical solution temperature. As described above, the second plasticizers 133 migrate to the surface of the variable adhesive layer 130b and further, are bled to the surface of the variable adhesive layer 130b, resulting in a sharp decrease in adhesion.

The first plasticizers 132 have a molecular weight greater than that of the second plasticizers 133. For example, the molecular weight of the first plasticizers 132 is 4 times or more or 10 times or more of the molecular weight of the second plasticizers 133. Accordingly, mobility of the second plasticizers 133 is better than that of the first plasticizers 132. At high temperature, the modulus of the variable adhesive layer 130 is reduced, and the second plasticizers 133 having good mobility migrate to the surface of the variable adhesive layer 130 having high entropy. For example, the first plasticizers 132 may have a molecular weight of 2,000 g/mol or more, 5,000 g/mol or more, 5,000 g/mol to 50,000 g/mol or 5,000 g/mol to 30,000 g/mol, and the second plasticizers 133 may have a molecular weight of 500 g/mol or less or 100 to 500 g/mol. However, the molecular weights of the first plasticizers 132 and the second plasticizers 133 are not limited thereto, and the molecular weight of the first plasticizers 132 may be four (4) times or more higher than the molecular weight of the second plasticizers 133, so that the plasticizers having a significant difference in mobility may be used.

When the first plasticizer and/or the second plasticizer is a multimer, oligomer, or polymer, the molecular weight may mean a number average molecular weight or a weight average molecular weight.

For example, the first plasticizer 132 may be one or more selected from polyisobutylene, polyisoprene, an isobutylene-isoprene copolymer, polyethylene glycol, polyethylene, polyester, polybutene, a naphthenic oil, and a process oil, but is not limited thereto.

For example, the second plasticizer 133 may be one or more selected from a phthalate-based compound, an aliphatic diester, a phosphate-based compound, a phosphite-based compound, chlorinated paraffin, glycol, an epoxy-modified vegetable oil (a soybean oil, linseed oil or the like), and butylene adipate (oligomer), but is not limited thereto.

For example, types of the phthalate-based compound include dimethyl phthalate, dibutyl phthalate, di-n-octyl phthalate, bis(2-ethylhexyl) phthalate, di-isononyl phthalate, di-n-decyl phthalate and di-isododecyl phthalate, and the like, but are not limited thereto.

For example, types of the aliphatic diester include adipate-based compounds such as bis(2-ethylhexyl) adipate and di-n-octyl adipate; sebacate-based compounds such as bis(2-ethylhexyl) sebacate and di-n-butyl sebacate; and an azelate-based compound such as bis(2-ethylhexyl) azelate, but are not limited thereto.

For example, the phosphate-based compound may be trioctyl phosphate, triphenyl phosphate or the like, and the phosphite-based compound may be triphenyl phosphite or the like. However, the present disclosure is not limited thereto.

The variable adhesive layer 130 may include from 50 to 150 parts by weight of the plasticizer mixture including the first plasticizers 132 and the second plasticizers 133 in 100 parts by weight of the block copolymer 131. Within this range, both adhesion reliability and reworking characteristics are satisfied. When the plasticizer mixture is included in an amount of less than 50 parts by weight, folding stress cannot be effectively alleviated due to high modulus, and the reworking process temperature may increase. When the plasticizer mixture is included in an amount of greater than 150 parts by weight, phase separation occurs even in a temperature range in which adhesiveness should be maintained high, so that adhesion reliability is not satisfied.

The weight ratio of the first plasticizers 132 to the second plasticizers 133 may be from 25:75 to 50:50, from 25:75 to 40:60 or from 25:75 to 35:65. Within this range, it is advantageous in that the low critical solution temperature is appropriate, adhesion reliability is excellent, and an easy rework process is allowed. When a ratio of the second plasticizers 133 in the plasticizer mixture is less than 50% by weight, a surface migration effect of the second plasticizers 133 is insufficient, whereby an on-off function of providing or not providing adhesion in a specific temperature range may not be effectively exhibited. When a ratio of the second plasticizers 133 in the plasticizer mixture exceeds 75% by weight, phase separation occurs due to surface migration of the second plasticizers 133 even within a temperature range in which the adhesion should be maintained high, and thus, adhesion reliability may be deteriorated.

Figure 3:
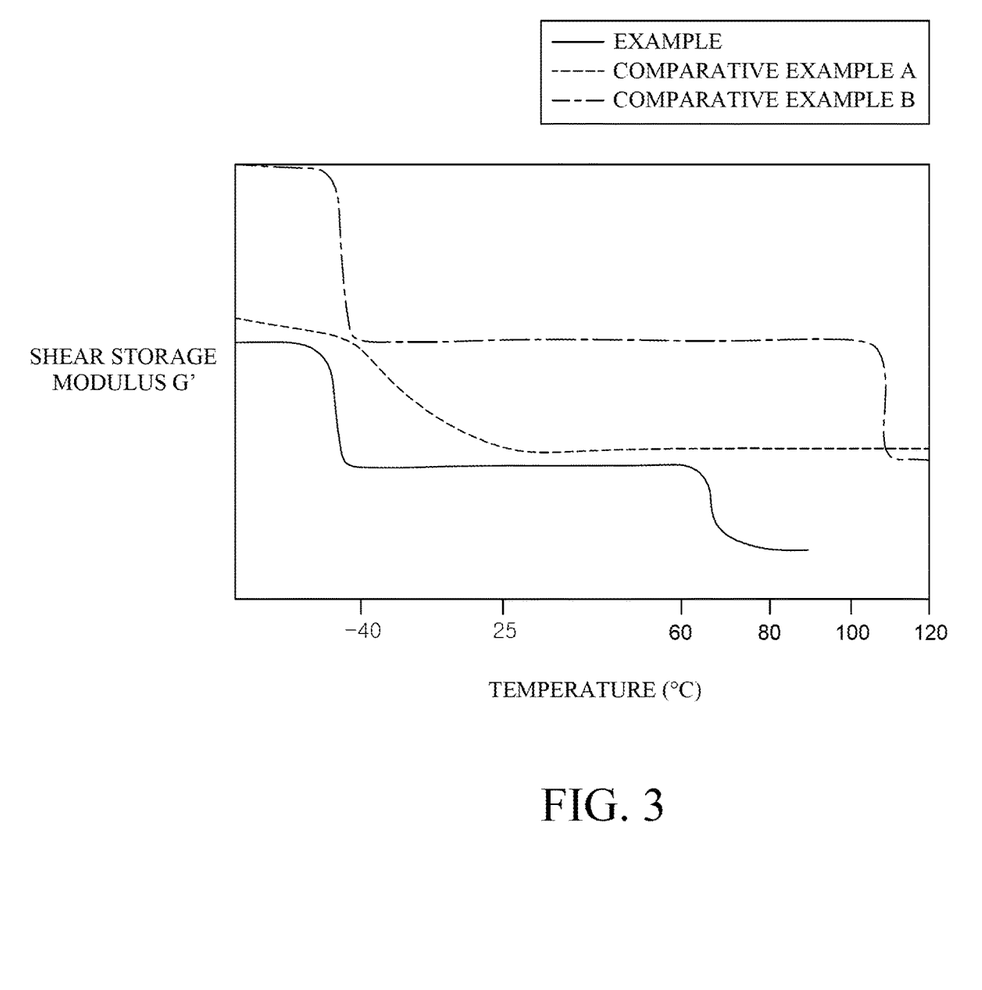
FIG. 3 is a graph schematically showing shear storage moduli G' of each of a variable adhesive layer according to an Example of the present disclosure and optically clear adhesives according to Comparative Examples A and B, as a function of temperature.

Hereinafter, effects of the variable adhesive layer 130 according to an exemplary embodiment of the present disclosure are described in more detail with reference to FIGS. 3 and 4. FIG. 3 is a graph schematically showing shear storage moduli G' of a variable adhesive layer according to an Example of the present disclosure and optically clear adhesives according to Comparative Examples A and B, as a function of temperature. The optically clear adhesive according to Comparative Example A includes an acrylic resin as a main component, and the optically clear adhesive according to Comparative Example B includes a diblock copolymer composed of a first block and a second block as a main component. The variable adhesive layer 130 according to an Example of the present disclosure includes the diblock copolymer 131 composed of a first block and a second block, the first plasticizers 132, and the second plasticizers 133 as main components. The mixture of the first plasticizers 132 and the second plasticizers 133 has a low critical solution temperature of 60° C. to 80° C.

With reference to FIG. 3, the optically clear adhesive according to Comparative Example A has properties, in which within a wide temperature range from −40° C. to 25° C., a transition occurs and thus, the shear storage modulus G' continuously decreases, but the shear storage modulus G' is uniformly maintained in a temperature range higher than room temperature. The optically clear adhesive according to Comparative Example A has a wide temperature range where a transition occurs, which means that a molecular weight distribution thereof is large. When the molecular weight distribution is large as described above, there is a problem in which the adhesion or modulus of the optically clear adhesive is non-uniform. When the transition occurs within a wide temperature range, it is difficult to control adhesive strength according to temperature, thereby leading to difficulties in implementing the on-off characteristics in which adhesive strength is provided or not provided in a specific range. In addition, in general, the lower the shear storage modulus of a material, the higher the peel strength. Thus, reworking is more advantageous as the shear storage modulus at the reworking process temperature is lowered. Specifically, to easily perform reworking, it is preferable to have a lower modulus after 60° C. at which adhesion should be maintained. However, it can be confirmed that the storage modulus of the optically clear adhesive according to Comparative Example A decreased within the range of −40° C. to 25° C., and then, was maintained uniformly until a high temperature of 120° C. Therefore, when the optically clear adhesive of Comparative Example A is used, it may be difficult to implement reworking in a range of 60° C. to 120° C.

With reference to FIG. 3 continuously, it can be confirmed that the optically clear adhesive according to Comparative Example B included two blocks having different glass transition temperatures, and accordingly, transitions occurred at −40° C. and 100° C., respectively, resulting in rapid decreases in shear storage modulus. In addition, it can be confirmed that the optically clear adhesive according to Comparative Example B included a polymer having a high glass transition temperature of about 100° C., and thus, had a relatively high shear storage modulus within the entire temperature range. Accordingly, it was difficult to relieve folding stress, and it can be confirmed that reworking was not facilitated due to high modulus even at high temperature (100° C.).

With reference to FIG. 3, it can be confirmed that in the variable adhesive layer 130 according to an exemplary embodiment of the present disclosure, transitions occurred around −40° C. and 70° C. That is, the variable adhesive layer 130 according to an Example of the present disclosure includes the same block copolymer 131 as the optically clear adhesive according to Comparative Example B, but the transition occurred at a lower temperature, compared to Comparative Example B. Thus, it is judged that an introduction of the first plasticizers 132 and the second plasticizers 133 reduces cohesive force between polymers and increases a flow, thereby leading to a transition at a relatively low temperature. In addition, it can be confirmed that the variable adhesive layer 130 of the present disclosure, including the first plasticizers 132 and the second plasticizers 133, had a lower shear storage modulus, compared to Comparative Example B. The variable adhesive layer 130 of the present disclosure has low shear storage modulus within a temperature range of 60° C. to 80° C., thereby providing an advantage of easy reworking.

Figure 4:
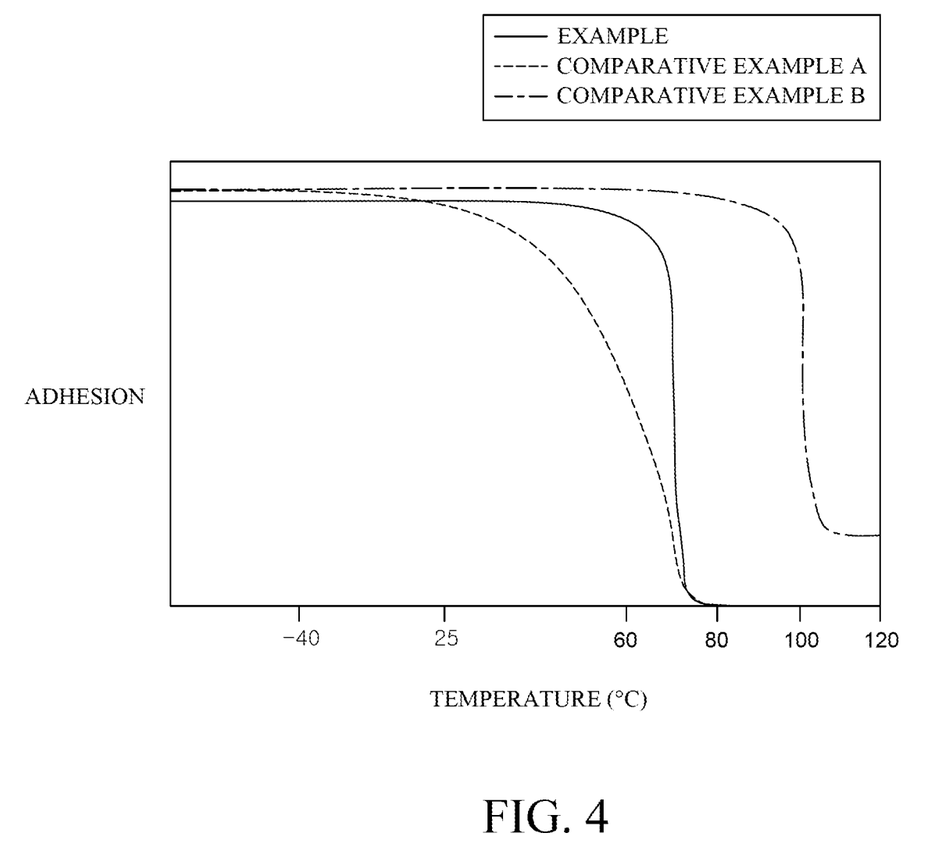
FIG. 4 is a graph schematically showing adhesion of each of a variable adhesive layer according to an Example of the present disclosure and optically clear adhesives according to Comparative Examples A and B, as a function of temperature.

FIG. 4 is a graph schematically showing adhesion of a variable adhesive layer according to an Example of the present disclosure and optically transparent adhesives according to Comparative Examples A and B, as a function of temperature. With reference to FIG. 4, it can be confirmed that adhesion of the optically clear adhesive according to Comparative Example A was maintained constantly in a range from −40° C. to 25° C., but after the range, continuously decreased in accordance with an increase in temperature. In particular, at 60° C., a value of adhesion was a half of an initial value thereof, and thereafter, the adhesion tended to decrease continuously until 80° C. That is, it could be confirmed, that the optically clear adhesive according to Comparative Example A is reworkable in the range of 60° C. to 80° C., but after room temperature, an adhesion gradient according to temperature occurs, thereby lowering adhesion reliability.

With reference to FIG. 4 continuously, it can be confirmed that the optically clear adhesive according to Comparative Example B maintained high adhesion within a wide temperature range from −40° C. to 100° C. That is, the optically clear adhesive according to Comparative Example B exhibits high adhesion even at high temperature (100° C.) by including a second block having a high glass transition temperature. Accordingly, when the display panel and the cover member are bonded using the optically clear adhesive according to Comparative Example B, a reworking process is feasible at a high temperature of 100° C. or more. However, when the reworking process is performed at the high temperature of 100° C. or more, thermal deformation of the display panel or optical control layer configuring the display device occurs, whereby reworking may not be facilitated.

With reference to FIG. 4 continuously, in the variable adhesive layer 130 according to an example of the present disclosure, the adhesion was maintained at a high level in a range from −40° C. to 60° C. without being lowered, but rapidly decreased within a temperature range of 60° C. to 80° C. Therefore, since the variable adhesive layer 130 according to an example of the present disclosure is excellent in adhesion reliability and also, reworkable at a relatively low temperature of 60° C. to 80° C., degradation of the display panel 110 or the optical control layer 120 can be prevented during a reworking process. As seen from FIG. 3, the variable adhesive layer 130 according to an example of the present disclosure exhibits low modulus properties, compared to the optically clear adhesive according to Comparative Example B, through the introduction of the plasticizers. In general, the lower the modulus of adhesive, the higher the adhesiveness. Thus, a reworking temperature increases. The variable adhesive layer 130 according to an exemplary embodiment of the present disclosure includes the first plasticizers 132 and the second plasticizers 133, and the mixture of the first plasticizers 132 and the second plasticizers 133 has a low critical solution temperature of 60° C. to 80° C. That is, a phase separation between the first plasticizers 132 and the second plasticizers 133 occurs at a temperature equal to or higher than the low critical solution temperature, whereby characteristics in which adhesion is lowered are exhibited. Therefore, the variable adhesive layer 130 exhibits the characteristics in which adhesive strength rapidly decreases due to the phase separation of the first plasticizers 132 and the second plasticizers 133 at 60° C. to 80° C., so that it provides advantages allowing for easy reworking while preventing thermal deformation of the display panel 110 and the optical control layer 120. At the same time, the variable adhesive layer 130 can lower the shear storage modulus by introducing the plasticizers and effectively reduce stress caused by folding.

In terms of securing excellent adhesion reliability, the adhesion of the variable adhesive layer 130 at 15° C. to 60° C. is preferably maintained at the same level as the initial adhesion. In addition, in terms of securing easiness of rework, the adhesion of the variable adhesive layer 130 at the temperature equal to or higher than the low critical solution temperature preferably has a value reduced by 50% or more or 70% or more, as compared to the initial adhesion (25° C.). For example, the adhesion of the variable adhesive layer 130 at the temperature equal to or higher than the low critical solution temperature may be preferably 0.60 Kgf/in or less or 0.4 kgf/in or less. When the adhesion of the variable adhesive layer 130 exceeds 0.60 Kgf/in at the temperature equal to or higher than the low critical solution temperature, the separation of the cover member 140 is not facilitated during reworking and after the separation, a cleaning time for the display panel 110 or the optical control layer 120 may increase. In addition, organic layers constituting the organic light emitting display panel 110 form physical bonding by simple lamination. When the adhesion of the variable adhesive layer 130 is too high at the temperature equal to or higher than the low critical solution temperature, physical bonding may be easily cut-off in a reworking process and thus, delamination may occur in the organic layers of the organic light emitting display panel 110 after reworking.

The variable adhesive layer 130 is disposed under the cover member 140 and needs to transmit light emitted from the display panel 110. Accordingly, it is preferable that a refractive index of each of the first plasticizers 132 and the second plasticizers 133 has a value close to that of the block copolymer 131 in order to secure high optical transmittance. For example, the refractive index of each of the first plasticizers 132 and the second plasticizers 133 may be 1.500 or more, 1.500 to 1.630, or 1.500 to 1.580, and within this range, differences in refractive index between components constituting the variable adhesive layer 130 are minimized, thereby allowing for high light transmittance.

Hereinafter, effects of the present disclosure described above through the Example and Comparative Examples will be described in more detail. However, the following Examples are for illustration of the present disclosure, and the scope of the present disclosure is not limited by the following Examples.

Components constituting variable adhesive layers in the following Examples and Comparative Examples are as below.

Block copolymer (MW: 75,000 g/mol): A poly (methyl methacrylate)-poly (n-butyl acrylate) diblock copolymer (PMMA-PBA block copolymer) in which a ratio of a poly (methyl methacrylate) block to a poly (n-butyl acrylate) block is 30:70 (wt %:wt %) was used. A glass transition temperature of the PMMA block was 100° C., and a glass transition temperature of the PBA block was −50° C.

First plasticizer: Polyisobutylene having a weight average molecular weight of 20,000 g/mol was used.

Second plasticizer: Dibutyl phthalate was used.

Example 1

A composition was prepared by dissolving the PMMA-PBA block copolymer, the first plasticizer, and the second plasticizer in amounts specified in Table 1 below. Then, after coating the composition on release paper, drying was performed thereon in an oven at 70° C. for 10 minutes to thereby manufacture a variable adhesive film. An organic light emitting display device was manufactured by bonding an organic light emitting display panel and a cover film using a variable adhesive film in a lamination process.

Examples 2 to 5

Variable adhesive films and display devices were manufactured in the same manner as in Example 1, with the exception that the contents of the first plasticizer and the second plasticizer were varied in amounts specified in Table 1 below.

Comparative Examples 1 to 6

Variable adhesive films and display devices were manufactured in the same manner as in Example 1, with the exception that the contents of the first plasticizer and the second plasticizer were varied in amounts specified in Table 1 below.

Reference Examples 1 to 4

Display devices were manufactured in the same manner as in Example 1, with the exception that four reworkable OCAs which are available from Nitta were used, instead of the variable adhesive film of Example 1.

Experimental Example

Whether to Bleed Plasticizers

First, after the variable adhesive films manufactured according to Examples 1 to 5 and Comparative Examples 1 to 6 were stored at 80° C., surfaces of the films were visually checked to evaluate whether or not the plasticizers were bled. Results are summarized in Table 1. When bleeding of the plasticizers on the surfaces of the films was visually confirmed, it is indicated by O, otherwise, it is indicated by X.

TABLE 1

|  | Examples | | | | | Comparative Examples | | | | | |
| --- | --- | --- | --- | --- | --- | --- | --- | --- | --- | --- | --- |
| Classification | 1 | 2 | 3 | 4 | 5 | 1 | 2 | 3 | 4 | 5 | 6 |
| Block Copolymer (parts by weight) | 100 | 100 | 100 | 100 | 100 | 100 | 100 | 100 | 100 | 100 | 100 |
| First Plasticizer (parts by weight) | 50 | 40 | 35 | 30 | 25 | 0 | 100 | 80 | 60 | 20 | 0 |

TABLE 1-continued

|  | Examples | | | | | Comparative Examples | | | | | |
|---|---|---|---|---|---|---|---|---|---|---|---|
| Classification | 1 | 2 | 3 | 4 | 5 | 1 | 2 | 3 | 4 | 5 | 6 |
| Second Plasticizer (parts by weight) | 50 | 60 | 65 | 70 | 75 | 0 | 0 | 20 | 40 | 80 | 100 |
| Whether to bleed plasticizers (at 80° C.) | O | O | O | O | O | X | X | X | X | O | O |

With reference to Table 1, in the variable adhesive films manufactured according to Examples 1 to 5, it can be confirmed that plasticizer components were bled to surfaces of the films at 80° C. That is, in the variable adhesive films according to Examples 1 to 5, the first plasticizer and the second plasticizer maintained a single phase, but at 80° C., it can be determined that the second plasticizer migrated to the surface, and phase separation occurred. It can be confirmed that no plasticizer was bled at 80° C. in Comparative Example 1 including no plasticizers, Comparative Example 2 using only the first plasticizer, and Comparative Examples 3 and 4 using an excessive amount of the first plasticizer, as compared to the second plasticizer. In addition, when only the second plasticizer was used (Comparative Example 6), or when an excessive amount of the second plasticizer was used, as compared to the first plasticizer (Comparative Example 5), the bleeding of the plasticizers can be confirmed.

That is, it can be confirmed that the bleeding of the plasticizers occurred when the second plasticizer was included in an amount equal to or higher than that of the first plasticizer.

Evaluation of Adhesion Reliability of Display Devices

In order to evaluate adhesion reliability of the display devices manufactured according to Examples 1 to 5, Comparative Examples 1 to 6, and Reference Examples 1 to 4, adhesion was measured at each temperature, and whether delamination occurred, and reworkability were evaluated. Results are summarized in Tables 2 and 3.

Adhesion (unit: kgf/in): Peel strength of 180 degrees was measured under a condition of a tensile speed of 5 mm/min using a universal tensile tester according to ASTM D3330-04 standard.

Reworkability: When rework was possible at 80° C., it is indicated by O, otherwise it is indicated by X.

Whether delamination occurred: It was evaluated whether delamination occurred in organic light emitting stacks after performing a rework process at 80° C. When delamination occurred, it is indicated by O, otherwise, it is indicated by X.

TABLE 2

|  | Examples | | | | |
|---|---|---|---|---|---|
| Classification | 1 | 2 | 3 | 4 | 5 |
| Initial Adhesion (at 25° C.) | 1.15 | 1.09 | 1.04 | 0.89 | 0.73 |
| High Temperature Adhesion (at 80° C.) | 0.56 | 0.33 | 0.25 | 0.22 | 0.20 |
| Reworkability (at 80° C.) | O | O | O | O | O |
| Whether delamination occurred | X | X | X | X | X |

With reference to Table 2, it can be confirmed that the variable adhesive films according to Examples 1 to 5 had high initial adhesion on levels of 1 kgf/in, and the levels of adhesion decreased to of 0.60 kgf/in or less at 80° C. That is, it can be confirmed that in the variable adhesive films according to Examples 1 to 5, adhesion reliability was excellent, while adhesion was reduced by 50% or more at 80° C., so that on-off characteristics in which the adhesion is provided or not provided were exhibited. This is consistent with what previously confirmed through plasticizer bleeding experiments. That is, it can be determined that high temperature adhesion was reduced compared to the initial adhesion due to the phase separation of the first plasticizer and the second plasticizer at 80° C. An anode, a hole injection layer, an organic light emitting layer, an electron transport layer, a cathode, and the like, constituting an organic light emitting display panel have a structure in which thin films are laminated through physical bonding and thus, are easily delaminated. As shown in Table 2, it can be confirmed that in the display devices manufactured using the variable adhesive films according to Examples 1 to 5, delamination did not occur in the organic light emitting stacks after a reworking process at 80° C. This means that reworking is feasible without affecting the organic light emitting stacks because the adhesion is sufficiently low at 80° C. due to the phase separation of the plasticizers.

TABLE 3

|  | Comparative Examples | | | | | | Reference Examples | | | |
|---|---|---|---|---|---|---|---|---|---|---|
| Classification | 1 | 2 | 3 | 4 | 5 | 6 | 1 | 2 | 3 | 4 |
| Initial Adhesion (at 25° C.) | 1.52 | 1.35 | 1.22 | 1.17 | 0.89 | 0.63 | 1.44 | 1.01 | 0.60 | 0.60 |
| High Temperature Adhesion (at 80° C.) | 1.85 | 1.32 | 1.01 | 0.88 | 0.29 | 0.37 | 0.81 | 0.59 | 0.25 | 0.25 |
| Reworkability (at 80° C.) | X | X | X | X | O | O | X | X | O | O |
| Whether delamination occurred | O | O | O | O | X | X | O | O | X | X |

With reference to Table 3, it can be confirmed that the variable adhesive films according to Comparative Examples 1 to 4 had both high initial adhesion and high temperature adhesion, and as a result, a reworking process was not facilitated at 80° C. In addition, it can be confirmed that delamination occurred in the organic light emitting stacks in the reworking process since the high temperature adhesion was high. In cases of Comparative Examples 5 and 6, it can be confirmed that the high temperature adhesion was sufficiently low by bleeding of the plasticizers at 80° C., as described above. Therefore, it was confirmed that the reworking process was feasible at 80° C. without affecting the organic light emitting stacks. In cases of the reworkable OCAs of Reference Examples 1 and 2, it can be confirmed that both the initial adhesion and the high temperature adhesion were high, so that the reworking process was not facilitated and delamination occurred in the organic light emitting stacks during the reworking process.

It was confirmed that in the reworkable OCAs of Reference Examples 3 and 4, high temperature adhesion was sufficiently low and thus, a reworking process could be easily performed without affecting the organic light emitting stacks, but initial adhesion was too low to satisfy adhesion reliability.

Evaluation of Folding Characteristics of Display Devices

To evaluate folding characteristics of the display devices manufactured according to Examples 1 to 5, Comparative Examples 1 to 6, and Reference Examples 1 to 4, foldability was measured under various conditions, and results are summarized in Tables 4 and 5.

Low Temperature Dynamic Foldability: A process of folding and unfolding the display devices at −20° C. using a bending test apparatus was repeated 50000 times (50K). Thereafter, when delamination occurred in the display devices, it is indicated by O, otherwise, it is indicated by X.

Dynamic Foldability at Room Temperature (25° C.) and High Temperature (80° C.): A process of folding and unfolding the display devices using a bending test apparatus was repeated, and while repeating the process, the number of times when delamination occurred was evaluated.

Static Foldability: After folding the display devices, it was observed whether folding states were maintained while the display devices were stored at 60° C. under conditions of 90% relative humidity (RH). When the folding state was maintained for 20 days, it is indicated by OK, otherwise, it is indicated by NG.

TABLE 4

| Classification | Examples | | | | |
|---|---|---|---|---|---|
| | 1 | 2 | 3 | 4 | 5 |
| Dynamic Foldability (at −20° C.) | ○ | ○ | ○ | ○ | ○ |
| Dynamic Foldability (at 25° C.) | 50K | 50K | 50K | 50K | 50K |
| Dynamic Foldability (at 80° C.) | 50K | 50K | 50K | 50K | 50K |
| Dynamic Foldability (at 60° C., RH 90%) | OK | OK | OK | OK | OK |

With reference to Table 4, it can be confirmed that the display devices using the variable adhesive films according to Examples 1 to 5 had excellent folding characteristics at −20° C., 25° C., and 80° C. In addition, it was confirmed that the folding states were maintained for 20 days under conditions of high temperature (60° C.) and high humidity (RH 90%). That is, it can be confirmed that the variable adhesive films according to Examples 1 to 5 had excellent folding characteristics within a wide temperature range from low temperature to high temperature.

TABLE 5

| Classification | Comparative Examples | | | | | | Reference Examples | | | |
|---|---|---|---|---|---|---|---|---|---|---|
| | 1 | 2 | 3 | 4 | 5 | 6 | 1 | 2 | 3 | 4 |
| Dynamic Foldability (at −20° C.) | O | O | O | O | 45K | 10K | X | X | X | X |
| Dynamic Foldability (at 25° C.) | 50K | 50K | 50K | 50K | 50K | 50K | X | X | X | X |
| Dynamic Foldability (at 80° C.) | 50K | 50K | 50K | 50K | 45K | 40K | — | — | — | — |
| Dynamic Foldability (at 60° C., RH 90%) | OK | OK | OK | OK | NG (1 day) | NG (4 days) | NG (1 day) | NG (1 day) | NG (1 day) | NG (1 day) |

With reference to Table 5, the display devices of Comparative Examples 1 to 4 satisfy folding characteristics. However, as described above, the plasticizers are not bled at 80° C., and thus, a rework process is infeasible, which deviates from objects of the present disclosure. In cases of Comparative Examples 5 and 6, as described above, the plasticizers are bled at 80° C., so the rework process is feasible, but as shown in Table 5, it can be confirmed that folding characteristics are deteriorated as compared to the Examples. In particular, it can be confirmed that the folding characteristics are deteriorated in high temperature and high humidity conditions.

In cases of Reference Examples 1 to 4, it can be confirmed that the folding characteristics are significantly deteriorated, as compared to the Examples in all temperature conditions.

In the display device according to an exemplary embodiment of the present disclosure, the display panel and the cover member are bonded to each other by using the variable adhesive layer having properties in which adhesion rapidly decreases at a specific temperature or more, while minimizing deformation or delamination of materials constituting the display device. Therefore, effects of excellent adhesion reliability and easy reworking are provided. Further, only the cover member can be replaced if necessary, thereby contributing to cost reduction and convenience.

In addition, the display device according to an exemplary embodiment of the present disclosure has advantages of excellent folding characteristics within a wide temperature range from low temperature to high temperature, and may be utilized as a foldable display device.

The exemplary embodiments of the present disclosure can also be described as follows:

According to an aspect of the present disclosure, there is provided a display device. The display device comprises a display panel, a variable adhesive layer disposed on the display panel and a cover member disposed on the variable adhesive layer, wherein the variable adhesive layer includes a block copolymer and a plasticizer mixture, wherein the plasticizer mixture has a low critical solution temperature (LCST) of 60° C. to 80° C.

The plasticizer mixture may include a first plasticizer and a second plasticizer, wherein a molecular weight of the first plasticizer may be 4 times or more a molecular weight of the second plasticizer.

A weight ratio of the first plasticizer to the second plasticizer may be 25:75 to 50:50.

The first plasticizer and the second plasticizer may be present in a single phase at a temperature lower than the low critical solution temperature, and may be phase-separated into two phases at a temperature equal to or higher than the low critical solution temperature.

The second plasticizer may migrate to a surface of the variable adhesive layer at a temperature equal to or higher than the low critical solution temperature.

The molecular weight of the first plasticizer may be 5,000 g/mol or more, and the molecular weight of the second plasticizer may be 500 g/mol or less.

The first plasticizer may be one or more selected from polyisobutylene, polyisoprene, an isobutylene-isoprene copolymer, polyethylene glycol, polyethylene, polyester, and polybutene.

The second plasticizer may be one or more selected from a phthalate-based compound, an aliphatic diester, and a phosphate-based compound.

The block copolymer may include a first block having a glass transition temperature of −20° C. or less and a second block having a glass transition temperature of 80° C. or more.

A weight ratio of the first block to the second block may be 65:35 to 85:15.

The first block may include an alkyl acrylate compound.

The second block may include one or more selected from an alkyl methacrylate compound and a vinyl aromatic compound.

The block copolymer may be a diblock copolymer or a triblock copolymer.

The block copolymer may have a weight average molecular weight of 70,000 g/mol to 100,000 g/mol.

A polydispersity index (PDI) of the block copolymer may be 1.00 to 1.15.

The variable adhesive layer, adhesion may be reduced by 50% or more, as compared to initial adhesion (25° C.) at a temperature equal to or higher than the low critical solution temperature.

The adhesion of the variable adhesive layer may be 0.4 kgf/in or less at the temperature equal to or higher than the low critical solution temperature.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device, comprising:
a display panel having a flexibility;
a variable adhesive layer disposed on the display panel; and
a cover member disposed on the variable adhesive layer,
wherein:
the variable adhesive layer includes a block copolymer and a plasticizer mixture;
the plasticizer mixture has a low critical solution temperature (LCST) of 60° C. to 80° C.;
the plasticizer mixture comprises a first plasticizer and a second plasticizer, wherein a molecular weight of the first plasticizer is four times or more higher than a molecular weight of the second plasticizer;
the first plasticizer and the second plasticizer are present in a single phase in the variable adhesive layer at a temperature lower than the low critical solution temperature, and are phase-separated into two phases in the variable adhesive layer at a temperature equal to or higher than the low critical solution temperature; and
the second plasticizer migrates to a surface of the variable adhesive layer at a temperature equal to or higher than the low critical solution temperature.

2. The display device of claim 1, wherein a weight ratio of the first plasticizer to the second plasticizer is from 25:75 to 50:50.

3. The display device of claim 1, wherein the molecular weight of the first plasticizer is 5,000 g/mol or more, and the molecular weight of the second plasticizer is 500 g/mol or less.

4. The display device of claim 1, wherein the first plasticizer comprises polyisobutylene, polyisoprene, an isobutylene-isoprene copolymer, polyethylene glycol, polyethylene, polyester, polybutene, or combinations thereof.

5. The display device of claim 1, wherein the second plasticizer comprises a phthalate-based compound, an aliphatic diester, a phosphate-based compound, or combinations thereof.

6. The display device of claim 1, wherein the block copolymer comprises two types of blocks having different glass transition temperatures to form a hard domain and a soft domain in the variable adhesive layer.

7. The display device of claim 1, wherein the block copolymer comprises a first block having a glass transition temperature of −20° C. or less and a second block having a glass transition temperature of 80° C. or more.

8. The display device of claim 7, wherein a weight ratio of the first block to the second block is from 65:35 to 85:15.

9. The display device of claim 7, wherein the first block is an alkyl acrylate compound.

10. The display device of claim 7, wherein the second block comprises an alkyl methacrylate compound, a vinyl aromatic compound, or a combination thereof.

11. The display device of claim 1, wherein the block copolymer is a diblock copolymer or a triblock copolymer.

12. The display device of claim 1, wherein the block copolymer has a weight average molecular weight of from 70,000 g/mol to 100,000 g/mol.

13. The display device of claim 1, wherein a polydispersity index (PDI) of the block copolymer is from 1.00 to 1.15.

14. The display device of claim 1, wherein the variable adhesive layer comprises from 50 to 150 parts by weight of the plasticizer mixture in 100 parts by weight of the block copolymer.

15. The display device of claim 1, wherein an adhesion of the variable adhesive layer is reduced by 50% or more, as compared to an initial adhesion of the variable adhesive layer at room temperature, at a temperature equal to or higher than the low critical solution temperature.

16. The display device of claim 15, wherein the adhesion of the variable adhesive layer is 0.4 kgf/in or less at the temperature equal to or higher than the low critical solution temperature.

* * * * *